United States Patent
Nozuyama

(10) Patent No.: US 7,913,143 B2
(45) Date of Patent: Mar. 22, 2011

(54) TEST QUALITY EVALUATING AND IMPROVING SYSTEM FOR SEMICONDUCTOR INTEGRATED CIRCUIT AND TEST QUALITY EVALUATION AND IMPROVEMENT METHOD FOR SEMICONDUCTOR INTEGRATED CIRCUIT

(75) Inventor: Yasuyuki Nozuyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 245 days.

(21) Appl. No.: 12/370,128

(22) Filed: Feb. 12, 2009

(65) Prior Publication Data

US 2009/0210764 A1 Aug. 20, 2009

(30) Foreign Application Priority Data

Feb. 15, 2008 (JP) ................................. 2008-034372

(51) Int. Cl.
  *G01R 31/28* (2006.01)
  *G06F 11/00* (2006.01)
  *G06F 17/50* (2006.01)
  *G06F 9/455* (2006.01)
  *G06G 7/62* (2006.01)

(52) U.S. Cl. ............ 714/741; 714/737; 703/13; 703/14; 703/23; 703/28; 716/103; 716/106; 716/112

(58) Field of Classification Search .................. None
See application file for complete search history.

(56) References Cited

U.S. PATENT DOCUMENTS

| | | | |
|---|---|---|---|
| 6,567,946 B1 | 5/2003 | Nozuyama | |
| 7,065,690 B1 * | 6/2006 | Yoshida et al. ............... 714/724 |
| 7,139,956 B2 * | 11/2006 | Nozuyama ..................... 714/741 |
| 7,162,674 B2 | 1/2007 | Nozuyama | |
| 7,308,660 B2 | 12/2007 | Nozuyama | |
| 2004/0133833 A1 * | 7/2004 | Nozuyama ..................... 714/738 |
| 2004/0205681 A1 * | 10/2004 | Nozuyama ........................ 716/4 |
| 2005/0010839 A1 | 1/2005 | Takeoka et al. | |

(Continued)

FOREIGN PATENT DOCUMENTS

JP 2006-010351 1/2006

OTHER PUBLICATIONS

T.W. Williams and N.C. Brown, "Defect Level as a Function of Fault Coverage," IEEE Trans. Comp., vol. C-30, pp. 987-988, Dec. 1981.

(Continued)

*Primary Examiner* — Robert Beausoliel
*Assistant Examiner* — Guerrier Merant
(74) *Attorney, Agent, or Firm* — Turocy & Watson, LLP

(57) ABSTRACT

A test quality evaluating and improving system has a fault-layout information link section which creates a weighted fault dictionary by correlating a layout element related to an undetected fault, out of faults corresponding to a specified fault model and occurring in a circuit to be tested, with the undetected fault as a weight of the undetected fault which cannot be detected by a test pattern for testing the faults; a test quality measure calculating section which multiplies the weight of the undetected fault, the failure mode-fault model correlation factor for correlating the failure mode of the layout element and the fault model, and the failure occurrence rate of each layout element, and outputs an obtained product as a failure remaining rate of the test pattern; a determining section; and a test point inserting section.

20 Claims, 10 Drawing Sheets

U.S. PATENT DOCUMENTS

| | | |
|---|---|---|
| 2005/0182587 A1 | 8/2005 | Sato et al. |
| 2006/0005094 A1 | 1/2006 | Nozuyama |
| 2007/0201618 A1 | 8/2007 | Nozuyama |
| 2007/0260408 A1* | 11/2007 | Nozuyama ..................... 702/59 |
| 2008/0120585 A1 | 5/2008 | Nozuyama et al. |

OTHER PUBLICATIONS

Sato, et al, Feasibility Evaluation of the Statistical Delay Quality Model, vol. J89-D, No. 8, pp. 1717-1728, 2006.

Sato, et al, Invisible Delay Quality—SDQM Model Lights Up what Could Not Be Seen, International Test Conference, 0-7803-9039-3, IEEE, 2005.

Nozuyama, et al, A Method of Estimating and Enhancing Test Quality Using Layout Information, The Institute of Electronics, Technical Report of IEICE, CPM2002-152 ICD2002-197, 2003.

Sengupta, et al, Defect-Based Test: A Key Enabler for Successful Migration of Structural Test, Intel Technology Journal Q1 '99.

* cited by examiner

| FAILURE MODE | FAILURE OCCURRENCE RATE | FAULT MODEL | FAILURE MODE-FAULT MODEL CORRELATION FACTOR | APPROXIMATE VALUE OF FACTOR |
|---|---|---|---|---|
| WIRING OPEN | fM0 | STUCK-AT FAULT (0) | cM0_sa0 | 1 |
| WIRING OPEN | fM0 | STUCK-AT FAULT (1) | cM0_sa1 | 0 |
| WIRING OPEN | fM0 | TRANSITION FAULT (SR and SF) | cM0_tr_SR and SF | 1 |
| WIRING OPEN | fM0 | TRANSITION FAULT (! SR and SF) | cM0_tr_! SR and SF | 0 |
| VIA OPEN | fV0 | STUCK-AT FAULT (0) | cV0_sa0 | 1 |
| VIA OPEN | fV0 | STUCK-AT FAULT (1) | cV0_sa1 | 0 |
| VIA OPEN | fV0 | TRANSITION FAULT (SR and SF) | cV0_tr_SR and SF | 1 |
| VIA OPEN | fV0 | TRANSITION FAULT (! SR and SF) | cV0_tr_! SR and SF | 0 |

FIG. 6

TEST QUALITY EVALUATING AND IMPROVING SYSTEM FOR SEMICONDUCTOR INTEGRATED CIRCUIT AND TEST QUALITY EVALUATION AND IMPROVEMENT METHOD FOR SEMICONDUCTOR INTEGRATED CIRCUIT

CROSS-REFERENCE TO RELATED APPLICATION

This application is based upon and claims the benefit of priority from the prior Japanese Patent Application No. 2008-34372, filed on Feb. 15, 2008, the entire contents of which are incorporated herein by reference.

BACKGROUND OF THE INVENTION

1. Field of the Invention

The present invention relates to a test quality evaluating and improving system provided for a semiconductor integrated circuit to evaluate and improve the test quality of the semiconductor integrated circuit, and a test quality evaluation and improvement method for the semiconductor integrated circuit.

2. Background Art

In recent years, various new failure modes have appeared in response to finer processes and an increasing number of wiring layers. Thus test quality demanded by customers has become hard to achieve only by test patterns generated for stuck-at faults (models) in LSIs of the prior art.

For example, the occurrence rate of short circuits between signal wires increases and thus it is necessary to consider bridge faults (models). Further, as LSIs become faster, the occurrence of abnormal delay increases with an increasing resistance on a via having the minimum size (hereinafter, will be simply referred to as VIA). Thus delay faults (models) have also become important.

However, when all fault models are considered and test patterns corresponding to the respective models are generated, resources and patterns are considerably increased (the test cost is also increased).

Thus in the presence of a number of failure modes, it is necessary to precisely estimate a failure rate at a customer (and a rejection rate in a system test before shipment) according to a test pattern applied to an LSI. In other words, for this estimation, it has become quite important to obtain a general test quality measure or a failure remaining rate in the LSI.

In other words, it is expected that test quality can be efficiently improved and test patterns can be effectively reduced by introducing a reliable test quality measure.

In the prior art, an LSI test quality measure belonging to the oldest category represents the relationship among a fault coverage, a failure remaining rate, and a yield.

For example, a defect level (failure remaining rate) "DL" is expressed by formula (1) (Williams-Brown model, for example, see T. W. Williams and N. C. Brown, "Defect Level as a Function of Fault Coverage", IEEE Trans. Comp., Vol C-30, pp. 978-988, December, 1981).

$$DL=1-Y^{(1-FC)} \quad (1)$$

where "Y" is a yield and "FC" is a fault coverage.

In formula (1), it is assumed that the probability of occurrence of faults is independently obtained as the same value "p".

On the assumption that "m" faults are detectable out of all the assumed faults "n" of a device under test (DUT) (that is, FC=m/n is established), the following will examine event A: all the "n" faults are not defective and event B: all the "m" faults are not defective. In these events, a conditional probability "P" (A|B)' is expressed by formula (2).

$$P(A|B)=P(A \cap B)/P(B)=(1-p)^n/(1-p)^m \quad (2)$$

In this case, $DL=1-P(A|B)$ and $Y=(1-p)^n$ are established. Thus the defect level "DL" is expressed by formula (3).

$$DL=1-Y^{(1-m/n)}=1-Y^{(1-FC)} \quad (3)$$

For example, when specific values are substituted into formula (3), the following result is obtained.

In the case of Y=70% and FC=99%, the failure remaining rate "DL" is 0.35% (3500 ppm).

In the case of Y=90%, it is necessary to set "FC" at 99.9% to achieve DL=100 ppm.

Formula (3) is valuable in that the fault coverage "FC" is correlated with the yield "Y" and the failure remaining rate "DL". However, it is known that formula (3) is determined based on the total number of assumed faults in an LSI and an obtained result does not always perfectly match with an actual result (may be different by one digit). Thus some improvements are obviously necessary. For example, formula (4) is used as an empirical equation.

$$DL=1-Y^{(1-\sqrt{FC})} \quad (4)$$

It is known that correlation between a failure remaining rate and a failure occurrence rate is improved to a certain extent by formula (4). However, this method lacks definite grounds and a result of the introduction of two or more fault models is not clear.

The yield "Y" can be also expressed by, for example, formula (5) on the assumption that just a few pieces of dust fall onto a chip and formula (5) complies with Poisson distribution.

$$Y=\exp[-A \cdot D0] \quad (5)$$

where "A" is an area of a target portion and "D0" is a density of dust.

By combining formula (3) and formula (5), relational expression (6) is obtained as follows:

$$DL=1-\exp[-A \cdot D0 \cdot (1-FC)] \quad (6)$$

In formula (6), when an exponential term is close to 0 (in other words, when the dust level is low and the fault coverage "FC" is high), formula (6) is approximated as expressed by formula (7) below.

$$DL \approx A \cdot D0 \cdot (1-FC) \text{ or } DL \approx A \cdot D0 \cdot (1-\sqrt{FC}) \quad (7)$$

In recent years, efforts have been made to improve accuracy by using not only overall dust information but also dust information corresponding to the critical area (CA) of each layer. However, correlation between a fault and a failure mode is insufficient and thus high correlation cannot be expected between the failure remaining rate "DL" and the fault coverage "FC".

Thus a weighted fault coverage obtained by adding a layout weight to each fault has been recently used in response to finer processes.

Further, in the test quality evaluation of the prior art, for example, attention is given to a fact that each fault can be correlated with a failure occurring on each layout element. A layout element corresponding to a failure is weighted, the achieved fault coverage of each fault model is determined based on relative failure occurrence rate information obtained by mainly accumulating a number of failure analysis results, and test patterns are efficiently generated. Thus required test quality can be achieved by the test pattern close to the minimum (for example, see Japanese Patent Laid-Open No. 2006-10351).

However, the prior art does not disclose how each resultant weighted fault coverage is quantified as an actual test quality measure of an LSI.

As described above, in the estimation of a failure remaining rate in an LSI, the rate being highly correlated with a failure (or rejection) rate in a market and so on, layout information directly correlated with a failure occurrence rate has been used in some techniques.

However, a proper relational expression has not been proposed yet. In other words, when calculating the level of failures remaining in a product after a shipping test, the calculation is based on a theoretical formula including an unclearly defined yield. Thus even when using a fault coverage and the like obtained by adding the weight of a layout element, the failure remaining rate in the product cannot be obtained with high accuracy.

Therefore, high correlation is hardly expected between a failure remaining rate and a failure (or rejection) rate in a market or an actual use, so that test quality is hard to improve in the prior art.

SUMMARY OF THE INVENTION

According to one aspect of the present invention, there is provided: A test quality evaluating and improving system for a semiconductor integrated circuit, comprising:

a fault-layout information link section which creates a weighted fault dictionary by correlating a layout element related to an undetected fault, out of faults corresponding to a specified fault model and occurring in a circuit to be tested, with the undetected fault as a weight of the undetected fault which cannot be detected by a test pattern for testing the faults;

a test quality measure calculating section which multiplies the weight of the undetected fault, the failure mode-fault model correlation factor for correlating the failure mode of the layout element and the fault model, and the failure occurrence rate of each layout element, and outputs an obtained product as a failure remaining rate of the test pattern;

a determining section which determines whether the failure remaining rate is not larger than a target value; and a test point inserting section which inserts, when the determining section determines that the failure remaining rate is larger than the target value, a test point into a logical net of the circuit to be tested, the test point being inserted to preferentially detect an undetected fault having a large weight based on the weighted fault dictionary.

According to further aspect of the present invention, there is provided: a test quality evaluating and improving system for a semiconductor integrated circuit, comprising:

a fault-layout information link section which creates a weighted fault dictionary by correlating a layout element related to an undetected fault, out of faults corresponding to a specified fault model and occurring in a circuit to be tested, with the undetected fault as a weight of the undetected fault which cannot be detected by a test pattern for testing the faults, and creates a weighted detected fault dictionary by correlating a layout element related to a detected fault with the detected fault as a weight of the detected fault which can be detected by the test pattern out of the faults;

a test quality measure calculating section which multiplies a sum of a weight of the undetected fault and a value obtained by multiplying the weight of the detected fault by a missing rate of other faults occurring on the layout element when the faults can be detected by the test pattern, a failure mode-fault model correlation factor for correlating a failure mode of the layout element and the fault model, and a failure occurrence rate of each layout element, and outputs an obtained product as a failure remaining rate of the test pattern;

a determining section which determines whether the failure remaining rate is not larger than a target value; and a test point inserting section which inserts, when the determining section determines that the failure remaining rate is larger than the target value, a test point into a logical net of the circuit to be tested, the test point being inserted to preferentially detect an undetected fault having a large weight based on the weighted fault dictionary.

According to still further aspect of the present invention, there is provided: a test quality evaluation and improvement method for a semiconductor integrated circuit, comprising:

creating a weighted fault dictionary by correlating a layout element related to an undetected fault, out of faults corresponding to a specified fault model and occurring in a circuit to be tested, with the undetected fault as a weight of the undetected fault which cannot be detected by a test pattern for testing the faults;

calculating a failure remaining rate of the test pattern by multiplying the weight of the undetected fault, a failure mode-fault model correlation factor for correlating a failure mode of the layout element and the fault model, and a failure occurrence rate of each layout element;

determining whether the calculated failure remaining rate is not larger than a target value; and inserting, when it is determined that the failure remaining rate is larger than the target value, a test point into a logical net of the circuit to be tested, the test point being inserted to preferentially detect an undetected fault having a large weight based on the weighted fault dictionary.

BRIEF DESCRIPTION OF THE DRAWINGS

FIG. 6 is a figure showing correlation between the failure modes (wiring (between cells) open failures) and the fault models;

DETAILED DESCRIPTION

In embodiments of the present invention, the test quality measure (remaining failure rate) of an LSI is calculated based on, for example, information about detected and undetected faults in a test on the LSI, correlation information for correlating an undetected fault and a failure of a layout element, the failure occurrence rate of each layout element, and the validity of fault detection (missing rate).

Thus it is possible to estimate test quality with higher accuracy than in the prior art.

Further, by using the calculation and estimation result, a test point is preferentially inserted into an undetected fault having a large weight.

Thus the test quality is improved in the present invention.

The embodiments to which the present invention is applied will be described below in accordance with the accompanying drawings.

First Embodiment

Figure 1:
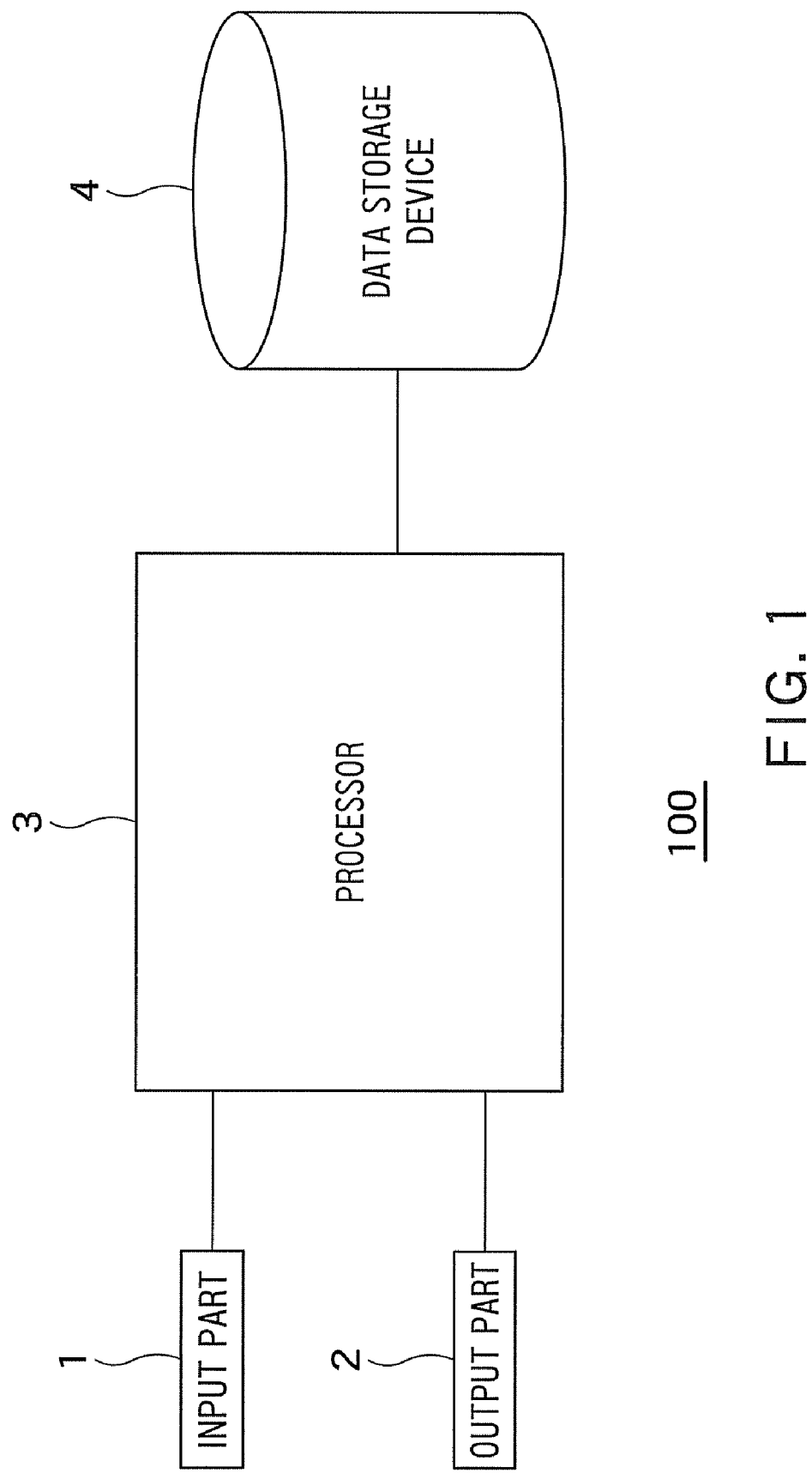
FIG. 1 is a block diagram showing the configuration of a test quality evaluating and improving system 100 for a semiconductor integrated circuit according to a first embodiment which is an aspect of the present invention.
Figure 2:
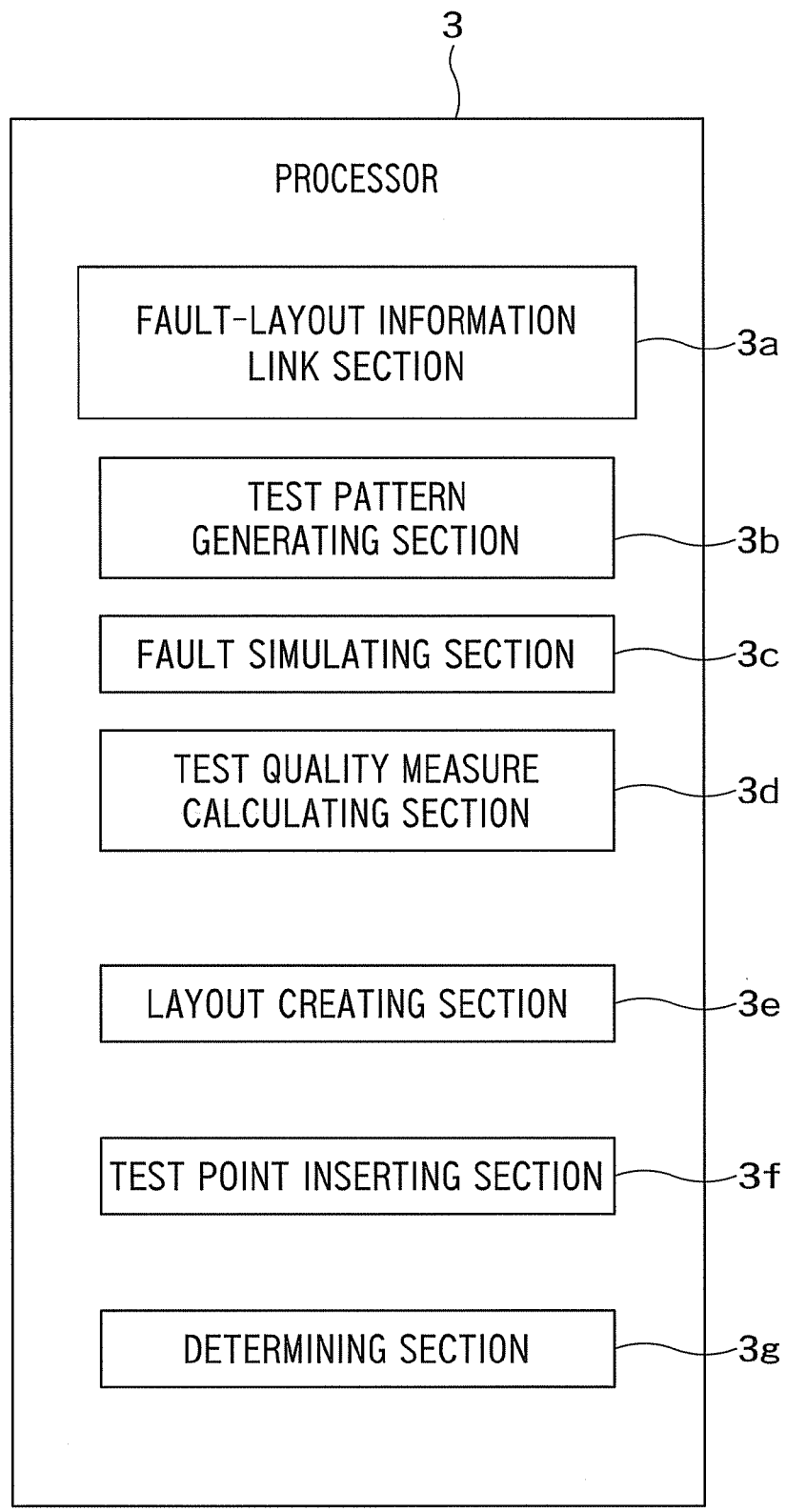
FIG. 2 is a block diagram showing an example of the configuration of a processor 3 in the test quality evaluating and improving system 100 provided for a semiconductor integrated circuit and shown in FIG. 1.
Figure 3:
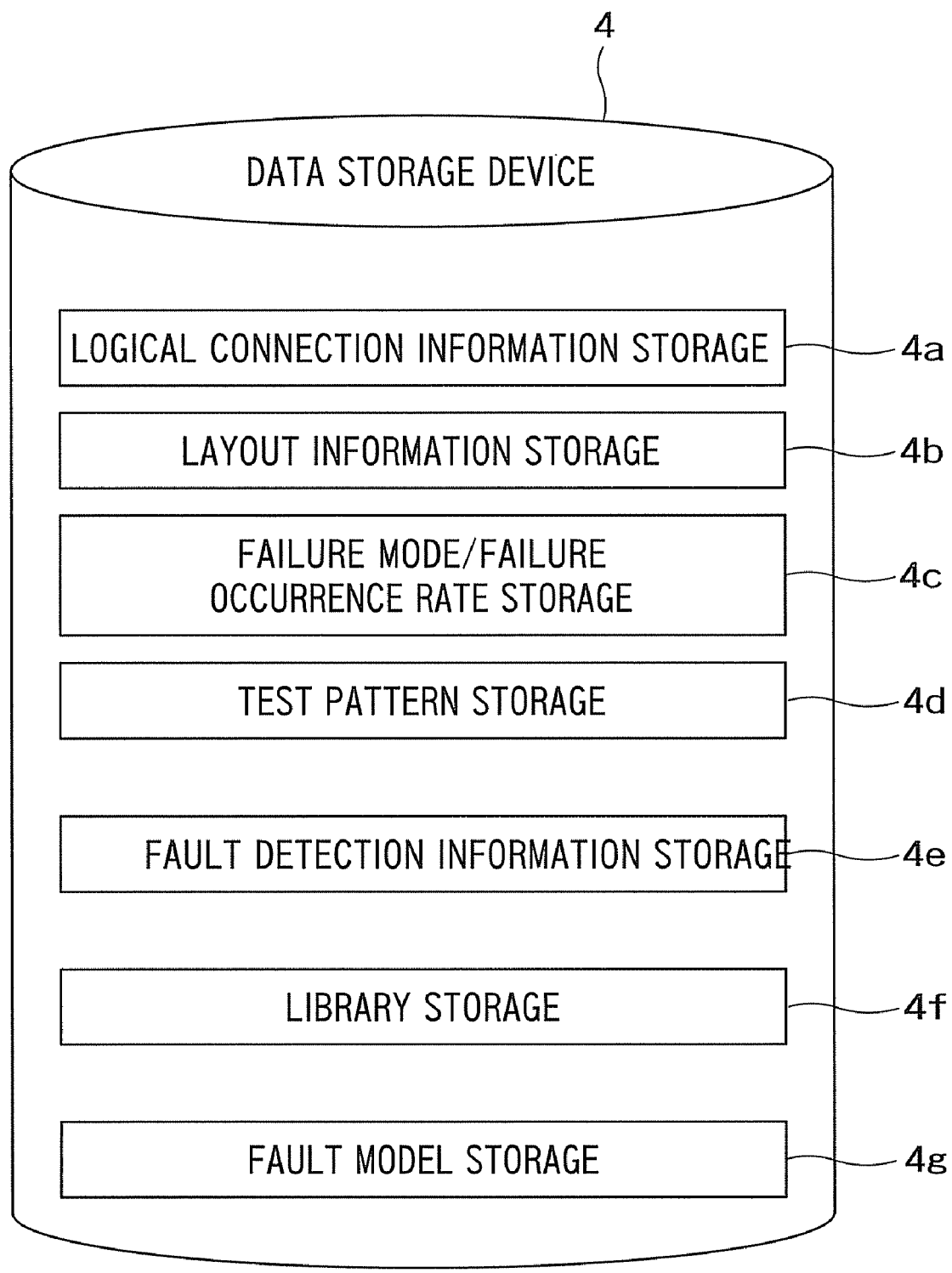
FIG. 3 is a block diagram showing an example of the configuration of a data storage device 4 in the test quality evaluating and improving system 100 provided for a semiconductor integrated circuit and shown in FIG. 1.

FIG. 1 is a block diagram showing the configuration of a test quality evaluating and improving system 100 for a semiconductor integrated circuit according to a first embodiment which is an aspect of the present invention. FIG. 2 is a block diagram showing an example of the configuration of a processor 3 in the test quality evaluating and improving system 100 provided for a semiconductor integrated circuit and shown in FIG. 1. FIG. 3 is a block diagram showing an example of the configuration of a data storage device 4 in the test quality evaluating and improving system 100 provided for a semiconductor integrated circuit and shown in FIG. 1.

As shown in FIG. 1, the test quality evaluating and improving system 100 for a semiconductor integrated circuit includes an input part 1, an output part 2, the processor 3, and the data storage device 4.

The input part 1 includes, for example, a keyboard, a mouse, and a recognition device such as an optical character reader (OCR), a graphics input device such as an image scanner, an external storage medium drive of a CD-R, a DVD, and a USB memory, a storage device connected via a network, and a special input device such as a voice recognition device. From the input part 1, necessary information is inputted to the processor 3.

The output part 2 includes, for example, a display such as a liquid crystal display and a CRT display, a printer such as an ink-jet printer and a laser printer, an external storage medium writer of a CD-R, a DVD, and a USB memory, and a storage device connected via a network. From the output part 2, information processed by the processor 3 is outputted.

As shown in FIG. 2, the processor 3 includes a fault-layout information link section 3a, a test pattern generating section 3b, a fault simulating section 3c, a test quality measure calculating section 3d, a layout creating section 3e, a test point inserting section 3f, and a determining section 3g.

The fault-layout information link section 3a extracts a predetermined layout element of layout information according to a specified fault model. Further, the fault-layout information link section 3a adds a weight to each assumed fault on the logical net of a circuit to be tested, so that a weighted fault dictionary D2 is created.

In other words, the fault-layout information link section 3a creates the weighted fault dictionary D2 by correlating a layout element related to an undetected fault, out of faults corresponding to the specified fault model and occurring in the circuit to be tested, with the undetected fault as a weight of the undetected fault which cannot be detected by a test pattern for testing the faults.

The test pattern generating section 3b automatically generates the test pattern for detecting the faults of the specified fault model in the circuit to be tested.

The fault simulating section 3c performs a fault simulation according to the fault model of the circuit to be tested, by using the test pattern corresponding to the specified fault model. The fault simulation makes it possible to obtain information about whether or not the faults of the specified fault model can be detected by the test pattern, for each layout element.

By performing the fault simulation using the test pattern, a fault dictionary D1 is created which is a list of detected faults and undetected faults by the test pattern. (In general, there are other status of faults as a result of the fault simulation, such as potentially detected faults, undetectable (redundant) faults. A way of treating these faults will be described later.)

The test quality measure calculating section 3d calculates the failure remaining rate of the test pattern based on weighted detected/undetected information, correlation information for correlating a fault and a failure of the layout element, and the failure occurrence rate of the layout element.

In other words, the test quality measure calculating section 3d multiplies the weight of the undetected fault, a failure mode-fault model correlation factor for correlating the failure mode of the layout element and the fault model, and the failure occurrence rate of each layout element, and outputs the obtained product as the failure remaining rate of the test pattern.

The layout creating section 3e creates a rough floor plan of a block from the logical net of the circuit to be tested after a design for testability (DFT), and disposes cells composing the block and arranges wiring (step S4). Thus temporary layout information is created.

The determining section 3g determines whether the failure remaining rate calculated by the test quality measure calculating section 3d is not larger than a target value.

The test point inserting section 3f inserts a test point (TP) into the logical net of the circuit to be tested (an example of the test point will be described later). The test point is inserted to externally observe a signal of an internal node, which is hard to observe, out of the internal nodes of the circuit to be tested. The test point inserting section 3f inserts the test point into the logical net of the circuit to be tested, such that an undetected fault having a large weight is preferentially detected based on, for example, a weight sort list which includes undetected faults and is outputted from the test quality measure calculating section 3d.

In other words, when the determining section 3g determines that the failure remaining rate is larger than the target value, the test point inserting section 3f inserts, into the logical net of the circuit to be tested, the test point for preferentially detecting an undetected fault having a large weight based on the weighted fault dictionary D2.

As shown in FIG. 3, the data storage device 4 includes a logical connection information storage 4a, a layout information storage 4b, a failure mode/failure occurrence rate storage 4c, a test pattern storage 4d, a fault detection information storage 4e, a library storage 4f, and a fault model storage 4g. The data storage device 4 may be a storage device connected via a network.

The logical connection information storage 4a stores the logical net of the circuit to be tested, after the design for testability is made and a test circuit is inserted into the circuit to be tested.

The layout information storage 4b stores layout information which includes the floor plan of the block of the circuit to be tested and the wiring, arrangement, and so on of the cells composing the block.

The failure mode/failure occurrence rate storage 4c stores a main failure mode affecting the quality of a target LSI, with the failure occurrence rate.

The failure mode includes, for example, complete open, a complete short circuit (resistance of 0), resistive open, and a resistive short circuit.

The failure occurrence rate includes, for example, the occurrence rate for each layout element and the occurrence rate for each failure mode.

The layout element includes, for example, power supply wiring (unit length), signal wiring (unit length), and a via having the minimum size (hereinafter, will be simply referred to as a via).

The test pattern storage 4d stores the test pattern generated by the test pattern generating section 3b.

The fault detection information storage 4e stores a list of faults estimated in the LSI according to each fault model of the LSI.

The fault detection information storage 4e stores the fault dictionary D1 which is a list of detected faults and undetected faults by performing the fault simulation using the test pattern. Further, the fault detection information storage 4e stores the weighted fault dictionary D2.

The library storage 4f stores libraries of information for specifying the operations of the cells of the circuit to be tested, cell position information, cell connection information, and so on.

The fault model storage 4g stores fault models corresponding to the failure mode. The fault models include a stuck-at fault, a bridge fault, and delay fault (transition fault, small delay fault). Further, the fault model storage 4g stores the failure mode-fault model correlation factor which indicates empirical correlation between each failure mode and the fault models.

In the "stuck-at fault", a logic of a node or a terminal in an LSI is fixed at a certain potential. The "bridge fault" is caused by a short circuit between adjacent wires. In the "delay fault", the delay of elements and wires which compose the circuit is increased and causes malfunction.

The following will describe an example of an operation for calculating a failure remaining rate by the evaluating system 100 configured thus for a semiconductor integrated circuit.

Figure 4:
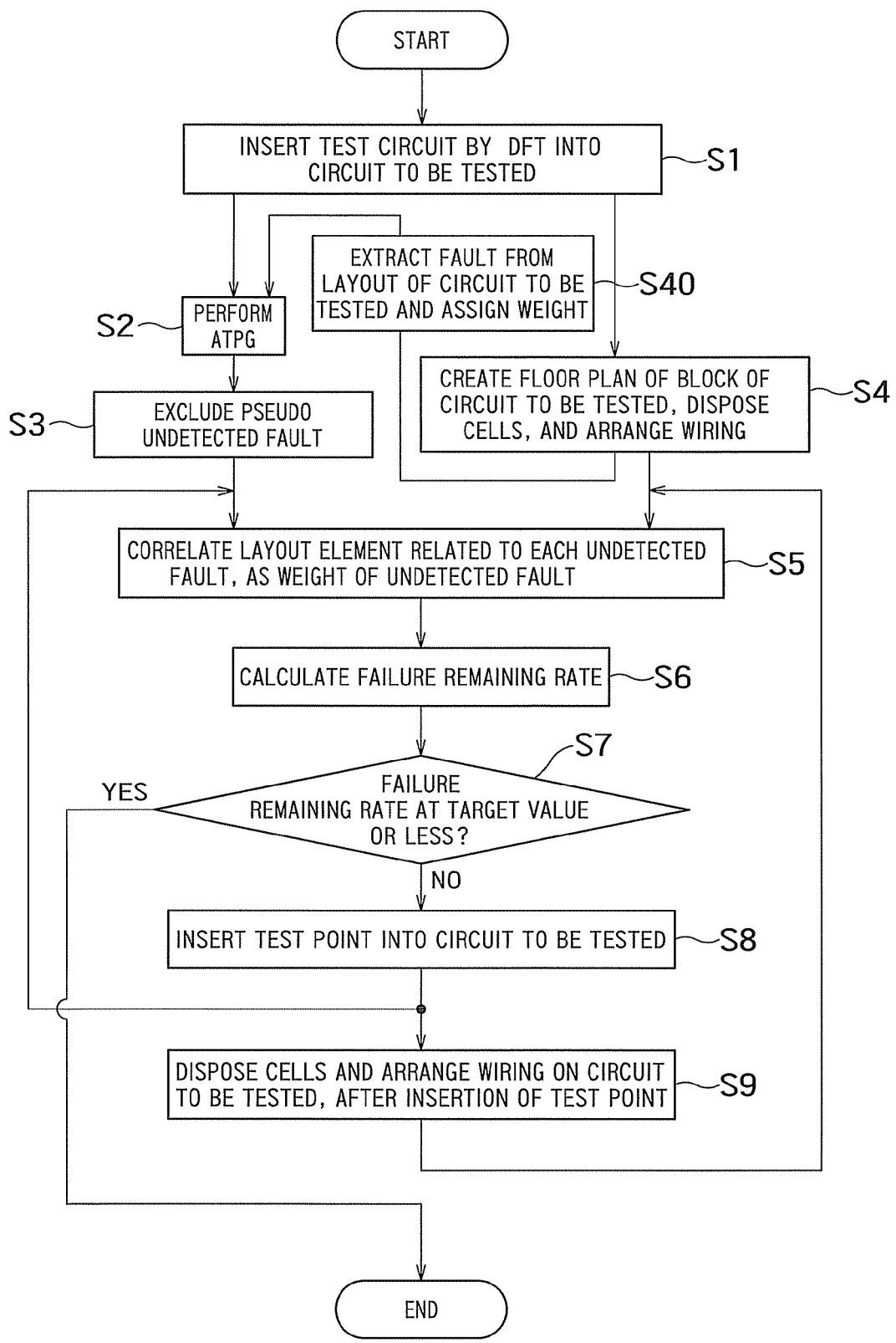
FIG. 4 is a flowchart showing the example of the operation for calculating a failure remaining rate by the evaluating system 100 for a semiconductor integrated circuit according to the first embodiment.

FIG. 4 is a flowchart showing the example of the operation for calculating a failure remaining rate by the evaluating system 100 for a semiconductor integrated circuit according to the first embodiment.

First, as shown in FIG. 4, design for testability (DFT) is performed on the circuit to be tested, by using the library stored in the library storage 4f for the circuit to be tested. In other words, the test circuit is inserted into the circuit to be tested (step S1), the test circuit being provided for generating a test pattern by using automatic test pattern generation (ATPG) and performing a fault simulation using test patterns including the generated pattern.

Further, the logical net of the circuit to be tested after DFT is stored in the logical connection information storage 4a.

Next, the logical net of the circuit to be tested after DFT is transferred to the layout creating section 3e, the rough floor plan of the block is created, the cells are disposed, and wiring is arranged (step S4). Thus the temporary layout information is created.

After that, for the circuit to be tested after design for testability, the fault-layout information link section 3a extracts, by using the temporary layout information, a fault such as a bridge fault to be extracted from the layout information, and then assigns a layout element as a weight to the faults of each target model (step S40) (it can be assumed that a stuck-at fault and the like is directly correlated with information obtainable from the logical net of the circuit to be tested). In order to detect these faults, automatic test pattern generation (ATPG) is performed (step S2).

In other words, the test pattern generating section 3b generates a test pattern for each specified fault model of the circuit to be tested after design for testability. If possible, a test pattern is preferentially generated in consideration of the weight of a layout element added to each fault. Further, the fault simulating section 3c simulates the faults of the circuit to be tested after design for testability (basically faults of different models), by using the generated test pattern. Thus information about whether a fault has been detected (detected fault) or undetected (undetected fault) can be obtained for each specified fault model.

The generated test pattern is stored in the test pattern storage 4d. Further, the result of the fault simulation (fault dictionary D1) is stored in the fault detection information storage 4e.

The fault simulation using the generated test pattern may make inconstant the output of the circuit to be tested and may include a potential detected fault which cannot be judged to be detected or undetected. However, the potential detected fault may be included in "partially" undetected faults after, for example, a multiplication by a proper value smaller than 1 (e.g., 0.2 to 0.5). Further, the faults generally include undetectable faults which can never be detected by any applied test pattern. Such undetectable faults are not included in detected faults or undetected faults.

In other words, it should be noted that only "undetected" faults related to the system operation of the LSI are extracted, that is, the undetected faults only include faults related to the system operation of the circuit to be tested.

In ATPG corresponding to scan design generally used for LSI in recent years, some faults are not covered by test pattern generation. Particularly faults in a circuit related to a test circuit where scan design has not been performed are left as undetected faults.

In such a circuit related to the test circuit where scan design has not been performed, the number of faults is small but the timing is not strictly restricted in many cases unlike in a circuit for the system operation. In many cases, the weight of a layout element corresponding to the circuit related to the test circuit is considerably larger than the weight of the circuit for the system operation. When a fault simulation on the circuit related to the test circuit is performed using the test pattern for detecting the faults of the circuit related to the test circuit, most of the faults are detected (these faults will be referred to as pseudo undetected faults).

Generally, the fault simulation requires quite a long processing time in a CPU. For this reason, pseudo undetected faults are made identifiable by, for example, an instance name (the macro cell identifiers of each basic cell, a memory, and so on in the LSI), a signal name, and so on. Further, the pseudo undetected faults have to be excluded from undetected faults in some way, for example, by estimating certain detection based on the information about names and so on.

In this way, after step S2, the pseudo undetected faults are excluded from undetected faults (step S3). When step S3 is performed after the step of assigning a weight to undetected faults (step S5), the degree of influence becomes clear and efficiency can be increased by excluding only faults having a significant impact. Thus step S3 may be placed after step S5.

In the case of a plurality of fault models, priority is first determined by considering whether or not the fault models correspond to a failure mode regarded as being dominant in the target LSI and what test patterns are generated. After that, test patterns are created in order of priority. For a test pattern generated for a certain fault model, a fault simulation is performed by ATPG according another fault model to confirm the level of collateral detection of faults. Thus it is possible to prevent the generation of excessive test patterns.

Next, the fault dictionary D1 where the pseudo undetected faults have been identified and the temporary layout information are read into the fault-layout information link section 3a. Further, the fault-layout information link section 3a extracts a predetermined layout element of the layout information according to a specified fault model. Moreover, for the specified fault model, the fault-layout information link section 3a adds the layout element as a weight to each fault estimated on the logical net. Particularly, the weight includes the weight of a layout element left undetected.

In other words, the fault-layout information link section 3a creates the weighted fault dictionary D2 by correlating a layout element related to an undetected fault, out of faults corresponding to the specified fault model and occurring in the circuit to be tested, with the undetected fault as a weight of the undetected fault which cannot be detected by a test pattern for testing the faults (step S5).

Next, the test quality measure calculating section 3d multiplies the weight of the undetected fault, the failure mode-fault model correlation factor for correlating the failure mode of the layout element and the fault model, and the failure occurrence rate of each layout element, and outputs the obtained product as the failure remaining rate "DL" of the test pattern (step S6).

After that, the determining section 3g determines whether the failure remaining rate "DL" calculated in step S6 is not larger than the target value (step S7).

When the failure remaining rate "DL" is not larger than the target value, it is determined that a desired failure remaining rate is obtained and the processing is completed.

When the remaining failure rate "DL" is larger than the target value, the process advances to subsequent step S8.

Next, the test point inserting section 3f inserts the test point into the net list of the circuit to be tested, after the design for testability (step S8).

In other words, when it is determined that the failure remaining rate "DL" is larger than the target value, the test point inserting section 3f inserts, into the logical net of the circuit to be tested, the test point for preferentially detecting an undetected fault having a large weight based on the weighted fault dictionary D2.

The undetected fault having been made detectable by the insertion of the test point is replaced with a detected fault, so that the fault dictionary D1 is updated. The updated fault dictionary D1 is used in step S5 again when the fault-layout information link section 3a creates the weighted fault dictionary D2.

Next, the layout creating section 3e disposes cells and arranges wiring on the circuit to be tested after the test point is inserted (step S9).

After step S9, the process returns to step S5. In step S5, in the fault-layout information link section 3a, a layout element related to an undetected fault is correlated with, as a weight of the undetected fault, the undetected fault of the updated fault dictionary D1 based on the updated fault dictionary D1 obtained in step S8 and the wiring and arrangement of the cells in step S9 on the circuit to be tested after the test point is inserted, so that the weighted fault dictionary D2 is created (updated). Since unexpected faults may be additionally detected by inserting the test point, the process may return to step S2.

In step S6 again, the test quality measure calculating section 3d multiplies the weight of the undetected fault, the failure mode-fault model correlation factor for correlating the failure mode of the layout element and the fault model, and the failure occurrence rate of each layout element, and outputs the obtained product as the failure remaining rate "DL" of the test pattern.

The failure remaining rate "DL" obtained thus is smaller than the failure remaining rate "DL" having been first calculated. This is because undetected faults are reduced by inserting the test point. Thus in subsequent step S7, the determining section 3g may determine the failure remaining rate "DL" is not larger than the target value.

When the failure remaining rate "DL" is larger than the target value, the flow after step S8 is performed again.

With the foregoing flow, the failure remaining rate is reduced to the target value or less and the test quality is improved.

The following will describe an example of a specific method for correlation between a fault and a layout element.

Figure 5:
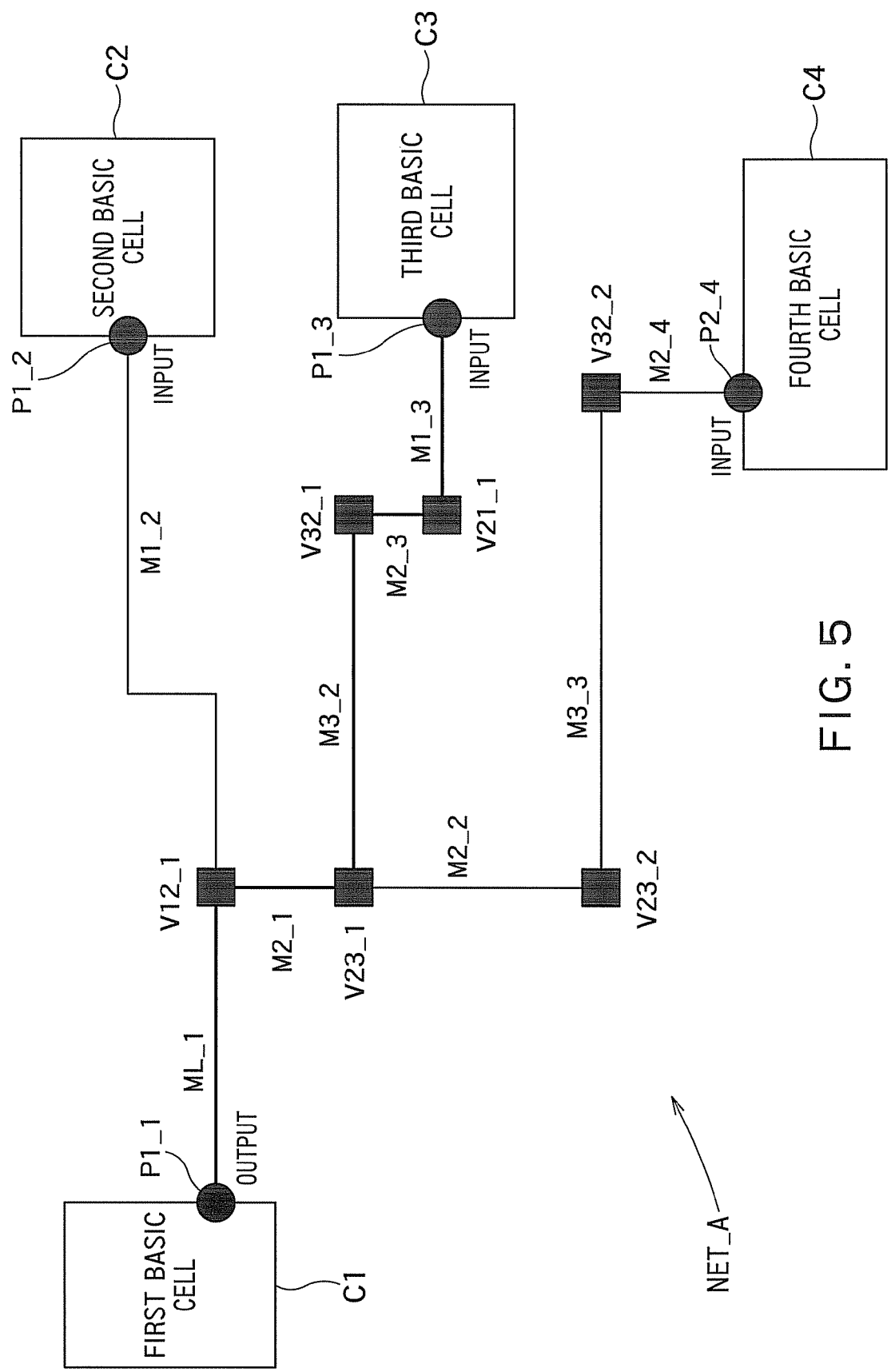
FIG. 5 illustrates an example of the assignment of the weight of the layout element in response to a stuck-at fault or a transition fault which is estimated on an input terminal P1_3.

FIG. 5 illustrates an example of the assignment of the weight of the layout element in response to a stuck-at fault or a transition fault which is estimated on an input terminal P1_3. The layout element includes the wiring length of a wiring element, the number of vias, and the area of a basic cell having the output terminal connected to a path.

In FIG. 5, "C" represents the basic cell, "P" represents the terminal, "M" represents the (metal) wiring element, and "V" represents the via having the minimum size (hereinafter, will be simply referred to as a "via").

As shown in FIG. 5, an input terminal P1_2 of a second basic cell C2 is connected to an output terminal P1_1 of a first basic cell C1 via wiring elements M1_1 and M1_2. A via V12_1 is disposed on the junction point of the wiring elements M1_1 and M1_2 but is not related to or included in a connection between the terminals P1_1 and P1_2.

An input terminal P1_3 of a third basic cell C3 is connected to the output terminal P1_1 of the first basic cell C1 via the wiring element M1_1, wiring elements M2_1, M3_2, M2_3, and M1_3, the via V12_1, and vias V23_1, V32_1, and V21_1.

An input terminal P2_4 of a fourth basic cell C4 is connected to the output terminal P1_1 of the first basic cell C1 via the wiring elements M1_1 and M2_1, wiring elements M2_2, M3_3, and M2_4, the via V12_1, and vias V23_2 and V32_2. The vias V12_1, V23_2, V32_1, V21_1, and V32_2 are formed to connect wires disposed in vertically adjacent wiring layers.

As shown in FIG. 5, the layout elements on a path (indicated by a thick line) from the output terminal P1_1, which outputs a signal to the input terminal P1_3, to the input terminal P1_3 are defined as weights.

For example, it is assumed that the fault of the input terminal P1_3 is left undetected and the fault of the other input terminal P1_2 is detected. In this case, a contradiction arises on the wiring element M1_1. Since the fault of the input terminal P1_2 is detected, the wiring element M1_1 is not included as an undetected layout element of the fault of the input terminal P1_3.

In this way, the fault-layout information link section 3a creates the weighted fault dictionary D2 including undetected faults with the layout elements added as weights.

Further, as in step S6, the test quality measure calculating section 3d calculates the failure remaining rate of the temporary layout information based on the weights of the weighted fault dictionary D2, failure occurrence rates stored in the failure mode/failure occurrence rate storage 4c, and failure mode-fault model correlation factors stored in the fault model storage 4g. The failure mode/failure occurrence rate storage 4c stores a main failure mode affecting the quality of the target LSI, with the failure occurrence rate. The fault model storage 4g stores the fault models corresponding to the failure mode.

The following will describe an example of a specific method of correlation between a failure mode and a fault model.

For example, a failure of metal open (MO) will be examined as a failure mode. In the case of metal open, power is not applied in complete open before test. Thus a wiring portion before a point where an open failure occurs is generally close to the ground potential during a test.

Therefore, in this case, when the fault model is a 0 stuck-at fault, a failure mode-fault model correlation factor cMO_sa0 is 1 and when the fault model is a 1 stuck-at fault, the failure mode-fault model correlation factor cMO_sa1 is 0.

In the "0 stuck-at fault", the logic is fixed at a certain potential taken as "0". In the "1 stuck-at fault", the logic is fixed at a certain potential taken as "1".

FIG. 6 shows correlation between the failure modes (wiring (between cells) open failures) and the fault models.

In FIG. 6, the failure mode-fault model correlation factors are provided for undetected faults.

For example, in the case of transition faults, an open fault can be detected when one of a slow-to-to rise (SR) fault and a slow-to-fall (SF) fault is detected. Thus the fault models are SR and SF (both are undetected) and !SR and SF (! indicates logical negation). This holds true for VIA open (VO) failures.

To be specific, the failure occurrence rates may be different among wiring layers and may be distinguished from one another when necessary. In this case, however, the failure occurrence rates have to be obtained for the respective wiring layers. Further, it is necessary to expand the function of a layout information extracting tool to obtain layout information for each wiring layer. Moreover, it is necessary to consider tradeoffs for an expected effect.

Figure 7:
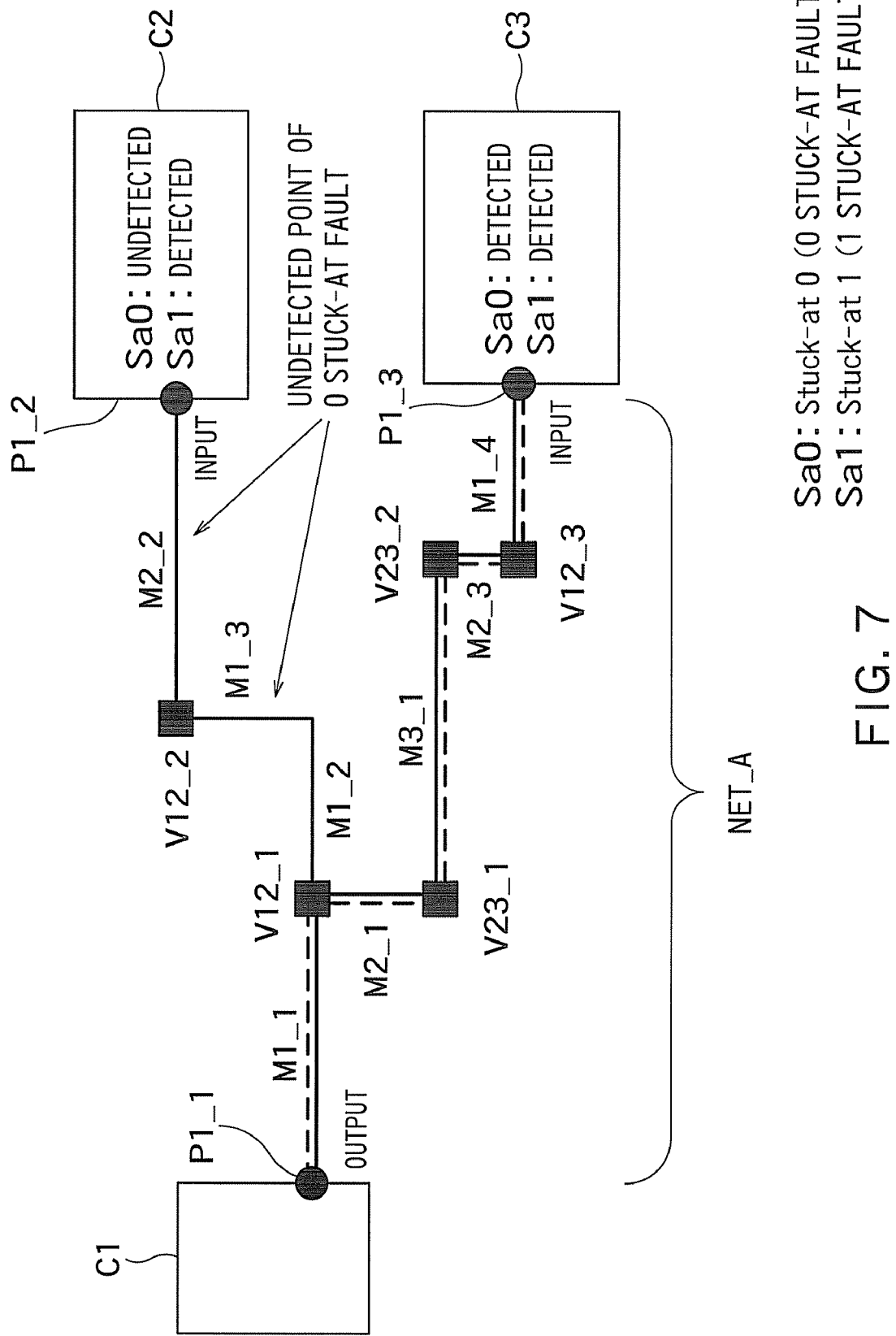
FIG. 7 is a figure showing a more specific example of calculation of a failure remaining rate.

FIG. 7 shows a more specific example of calculation of a failure remaining rate.

In FIG. 7, layout portions indicated by arrows are left as undetected 0 stuck-at faults (sa0: stuck-at 0).

Thus the failure remaining rate "DL" of a complete open failure (defect) in a net A is the total sum of "a" to "c" described below.

Further, it is assumed that a wiring length (first layer) is a weight of {WL(M1_2)+WL(M1_3)}, a wiring length (second layer) is a weight of "WL(M2_2)", and the number of vias (first to second layers) is a weight of "n" (V12).

When considering the stuck-at fault models, the failure mode-fault model correlation factor cVO_sa0 (0 stuck-at fault)=1 and the failure mode-fault model correlation factor cVO_sa1 (1 stuck-at fault)=0 are established.

$$a=\{WL(M1\_2)+WL(M1\_3)\} \times fMO \times cMO\_sa0$$

$$b=WL(M2\_2) \times fMO \times cMO\_sa0$$

$$c=n(V12) \times fVO \times cVO\_sa0$$

In the case of a resistive open failure, for example, when the resistance distribution of a resistive open VIA for a via is obtained, it is necessary to consider the resistance distribution, a load-driving capacity determined from a target faulty point, and a ratio of a static timing analysis result of passage through the target faulty point and (the delay time of) an actually activated logical path, resulting in a complicated expression.

Regarding the occurrence rate of a bridge fault, it is the easiest to define the occurrence rate according to the lengths of the adjacent wiring elements (adjacent wiring lengths) of a pair of adjacent wires within a certain access distance. However, more specifically, the failure occurrence rate also depends upon an adjacent distance and the wiring layers. Thus in consideration of the dependence of these failure occurrence rates, it is possible to define more detailed failure occurrence rates according to the adjacent wiring length, the adjacent distance, and the wiring layers.

However, the function of extracting layout information has to be greatly expanded and a turn around time (TAT) also deteriorates. Thus it is important to make a comprehensive decision and select a practical definition.

Further, the extraction of layout information involves a failure in the market and the like caused by a failure occurring on a portion not obtained by layout information between basic cells. Thus in order to increase correlation accuracy, it is desirable to somehow consider failures in cells.

For example, the failure occurrence rates of the layout elements composing the basic cell, a contact between poly Si and first layer metal wiring, the first layer metal wiring, a VIA between first and second metals, and so on are frequently monitored in a periodic manner by a test element group (TEG) and the like as in layout elements used for other wiring between cells. Thus these pieces of information may be obtained for each cell and may be used as appropriate.

As described above, based on an undetected fault "l" obtained by excluding the pseudo undetected faults of detected/undetected information about fault models "k" according to a test pattern applied to the LSI, each layout element amount "Wik" (UD,l) correlated with each undetected fault "l", a fault occurrence rate "fij" of each failure mode, and a failure mode "i"—fault model "k" correlation factor, the test quality measure calculating section 3d calculates the test quality measure (failure remaining rate) "DL" for the failure mode "i", which affects the LSI, as expressed in formula (8).

$$DL=\Sigma\Sigma\Sigma\Sigma_{(i,j,k,l)} fij \times Cik \times Wjk(UD,l) \quad (8)$$

(wjk is not counted in a redundant manner)

where "DL" is a failure remaining rate, "fij" is a failure occurrence rate corresponding to a layout element "j" of the failure mode "i" (for each layout element), "Cik" is a failure mode-fault model correlation factor (effective expression provided to avoid redundant count) corresponding to the failure mode "i"—fault model "k", and "Wjk (UD,l)" is the weight of the layout element "j" correlated with the undetected (UD) fault "l" (pseudo undetected faults have been excluded) of each fault model "k".

In (8), regarding the sum of fij×cik×Wjk(UD,l), when the same layout element "Wj" is to be detected for a plurality of fault models in the same failure mode "i" (when $Wjk_1$, $Wjk_2$, ... are present), it should be noted that redundant count has to be avoided. To be specific, the layout element "Wj" having been detected for one of the fault models "k" is not counted as a part of "DL" even when the layout element "Wj" is undetected for other fault models. On the other hand, when the fault model "k" for the detected layout element "Wj" has a failure mode-fault model correlation factor of less than 1, the layout element "Wj" is counted. When the two or more correlation factors are less than 1, for example, when $cik_1$, $cik_2$, . . . are present (<1), the failure mode-fault model correlation factor corresponding to the failure mode "i"—the fault model "k" (=one of $k_1$, $k_2$, . . . ) determined in consideration of redundant count is expressed as follows:

$$Cik=\{1-(1-cik_1)\times(1-cik_2)\times \ldots\}/(\text{the number of fault models})$$

where "Cik" is equal to the correlation factor $cik_1$ when only an individual fault model $k_1$ is present.

As a result of calculation of the failure remaining rate for the temporary layout information, the failure remaining rate may not reach the target value which is a necessary test quality measure (failure remaining rate). In this case, the test point is automatically inserted to an undetected fault having a large weight (step S8), so that the undetected fault having the large weight can be preferentially detected. Thus the test quality is improved.

For example, when the weights of the layout elements are added to faults, the weights may vary from one another. In this case, undetected faults are sorted in descending order of weight. Further, for example, the test point is inserted to the undetected fault having the large weight (step S8) and a test is conducted according to ATPG. Thus there is a high probability that the failure remaining rate "DL" can be reduced.

Therefore, target undetected faults can be efficiently reduced by inserting the test points fewer than the number of undetected faults. The test points include a control point for setting a target net at a desired value and an observation point enabling observation of the value of the target net from the outside of the LSI.

The easiest insertion of the test point is an automatic insertion of the observation point. The observation point includes an F/F enabling a scanning operation and the target net is connected to the observation point.

A plurality of nets where the observation points are to be inserted are combined by an XOR (exclusive OR) gate and the like, and then the nets may be inputted to the F/F or may be observed by the external terminal of the LSI. Thus it is also possible to effectively reduce additional circuits required for the insertion of the observation points.

Further, a weight may be calculated for each undetected fault of each fault model and the undetected faults may be sorted in the descending order of weight, and then a test pattern may be added to preferentially detect an undetected fault having a large weight. Thus the failure remaining rate can be efficiently reduced and the test quality can be improved without inserting the test points.

Undetected faults are combined for, for example, each functional block which is likely to be a target of test pattern generation. Further, the test pattern is preferentially added from the functional block where the total weight of undetected faults is large. Thus the test quality can be efficiently improved.

As described above, in the present embodiment, the undetected faults of the plurality of fault models which are regarded as being effective for detecting the failure mode of each layout element are correlated with the weights of the layout elements in the plurality of failure modes in the LSI.

The products of the weights of the layout elements, the failure occurrence rates of the failure modes, and the failure mode-fault model correlation factors are obtained, and the failure occurrence rates are precisely correlated with the layout elements corresponding to the undetected faults.

Further, the sum of the products is used as the test quality measure (failure remaining rate "DL") of the circuit to be tested (step S7, formula (8)).

Thus the obtained test quality measure (failure remaining rate "DL") is considerably increased in accuracy of correlation with a market failure rate (and the sum of the market failure rate and a rejection rate in a system test before shipment) caused by failures on the target logical net of the LSI, as compared with the test quality measure of the prior art.

In other words, it is possible to create effective test patterns for detecting faults, thereby improving the test quality.

As described above, the test quality evaluating system for a semiconductor integrated circuit and a test quality evaluation method for the semiconductor integrated circuit according to the present embodiment make it possible to improve the test quality.

Second Embodiment

In the first embodiment, failures are judged to be detected in each fault model by using a plurality of fault models capable of covering various failure modes of the LSI and the accuracy of actually detecting the failures is considered in the calculation of a test quality measure (failure remaining rate).

Thus the first embodiment is effective for achieving high test quality. In reality, however, it is not always easy to define the fault models for all the failure modes and develop a test pattern generation tool. In many cases, failures are handled by limited ones of the fault models.

In this case, for example, even when a failure is judged to be "detected" in a test based on a certain fault model (generally a stuck-at fault model), failures of other fault models may not be actually detected. Thus in order to improve the accuracy of correlation between a failure remaining rate and a return rate and so on, it is necessary to precisely estimate the failures having not been actually detected.

A second embodiment will describe the calculation of a failure remaining rate in consideration of the frequency of occurrence of an actually undetected fault which has been judged to be "detected". As the frequency, a missing rate is used which is defined by a rate of failures occurring on layout elements and missed in a fault simulation when another certain fault can be detected by the fault simulation using a test pattern.

In consideration of the "missing rate", a test quality measure (failure remaining rate) is expressed by, for example, formula (9) below.

$$DL=\Sigma\Sigma\Sigma_{(i,j,l)}fij\times ci\times\{pij(l)\times Wj(D,l)+Wj(UD,l)\} \quad (9)$$

where "DL" is a failure remaining rate, "fij" is a failure occurrence rate corresponding to a layout element "j" of a failure mode "i" (for each layout element), "ci" is a failure mode-fault model correlation factor corresponding to a failure mode "i"-base fault model, "pij(l)" is the missing rate of a failure of the failure mode "i" corresponding to a base fault (pseudo undetected faults have been excluded) "l" having been judged to be "detected", "Wj(D,l)" is the weight of the layout element "j" correlated with a detected (D) fault "l" (pseudo undetected faults have been excluded) of a base fault model, and "Wj(UD,l)" is the weight of the layout element "j" correlated with an undetected (UD) fault "l" (pseudo undetected faults have been excluded) of the base fault model.

As expressed in formula (9), a value obtained by multiplying the weight correlated with the detected fault by the missing rate is added to the weight "Wi(UD,l)" correlated with the undetected fault. Other points are similar to formula (8).

In formula (9), the missing rate "pij(l)" is mainly empirically obtained. The missing rate is stored in, for example, a fault model storage 3g of a data storage device 3 so as to correspond to the fault model.

Figure 8:
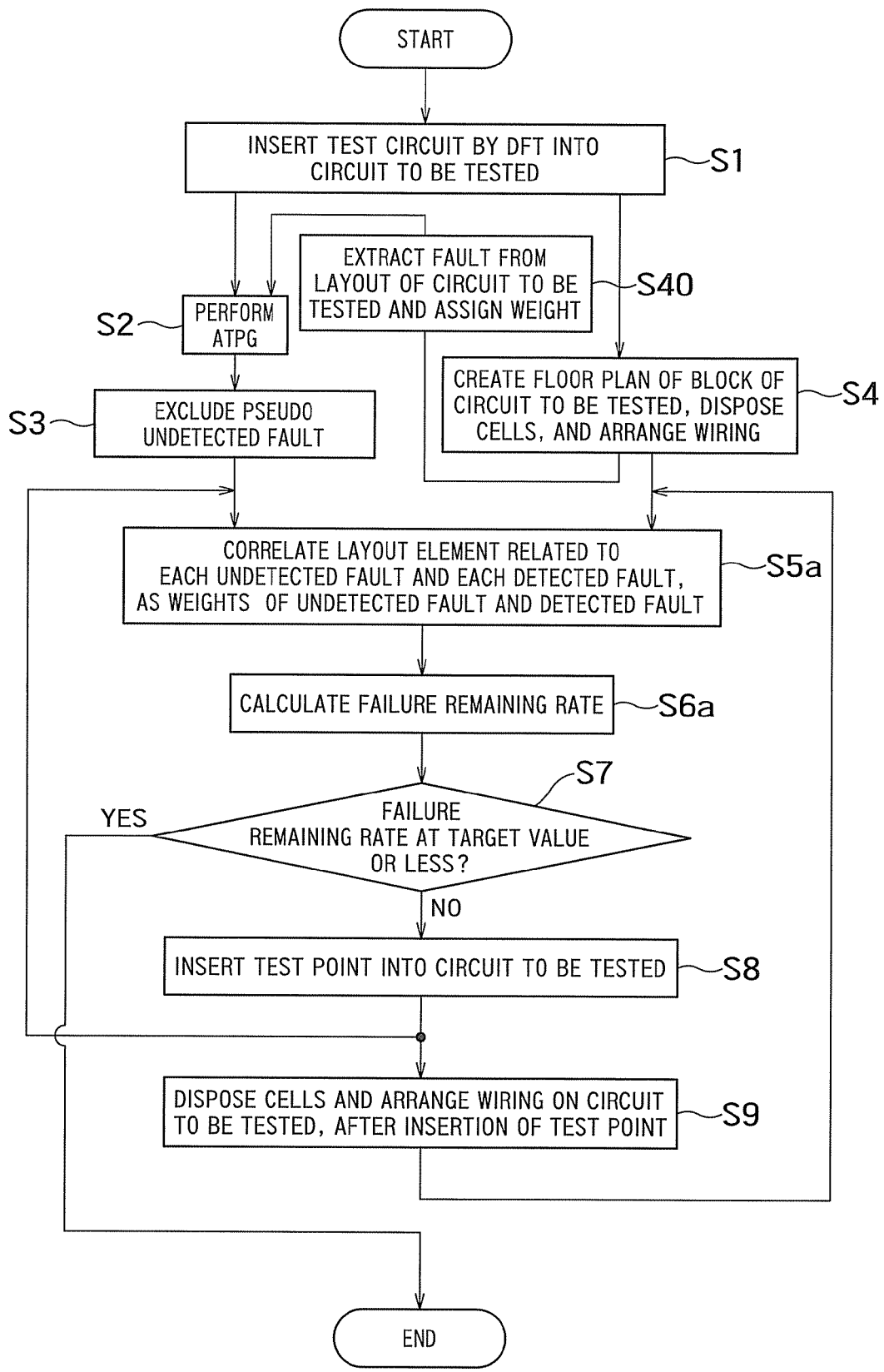
FIG. 8 is a flowchart showing an example of an operation for calculating a failure remaining rate according to the second embodiment.

FIG. 8 is a flowchart showing an example of an operation for calculating a failure remaining rate according to the second embodiment. A flow from step S1 to step S4 and a flow from step S8 to step S9 in FIG. 8 are similar to the flows of FIG. 4 of the first embodiment. Further, a test quality evaluating system for a semiconductor integrated circuit according to the second embodiment is configured as the test quality evaluating system 100 for a semiconductor integrated circuit in FIG. 1.

As shown in FIG. 8, after step S4, a fault dictionary D1 including identified pseudo undetected faults and temporary layout information are read into a fault-layout information link section 3a. The fault-layout information link section 3a extracts a predetermined layout element of layout information according to a specified fault model. Further, for the specified fault model, the fault-layout information link section 3a adds, as a weight, the layout element to each assumed fault on the logical net.

In other words, the fault-layout information link section 3a creates a weighted detected fault dictionary D2 by correlating a layout element related to an undetected fault, out of faults corresponding to the specified fault model and occurring in the circuit to be tested, with the undetected fault as a weight of the undetected fault which cannot be detected by a test pattern for testing the faults, and correlating a layout element related to a detected fault with the detected fault as a weight of the detected fault which can be detected by the test pattern out of the faults.

Next, the test quality measure calculating section 3d multiplies the sum of a value obtained by multiplying the weight of the detected fault by the missing rate and the weight of the undetected fault, the weight of the undetected fault, a failure mode-fault model correlation factor for correlating the failure mode of the layout element and the fault model, and the failure occurrence rate of each layout element, and the obtained product is calculated as a failure remaining rate "DL" of the test pattern (step S6a).

After step S6a, the flow is similar to the flow of FIG. 4 of the first embodiment. As in the first embodiment, the flow of FIG. 8 makes it possible to reduce the failure remaining rate to a target value or lower and improve test quality in consideration of the missing rate.

Figure 9:
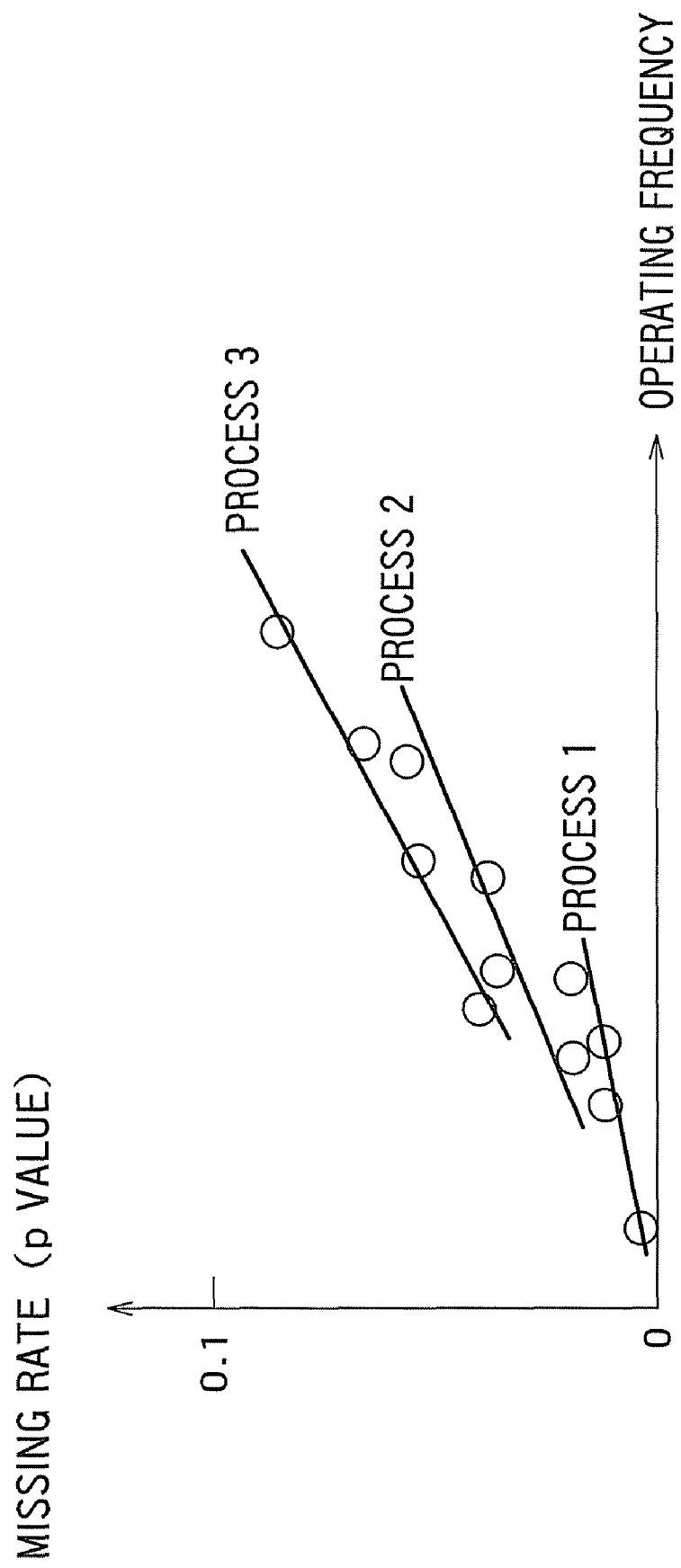
FIG. 9 is a figure showing the relationship between the missing rate "p" and an operating frequency.

The following will briefly describe a method of determining a missing rate "p". FIG. 9 shows the relationship between the missing rate "p" and an operating frequency. In FIG. 9, other parameters such as a circuit size may be used instead of the operating frequency.

To be specific, when the missing rate "p" in formula (10) is plotted for a plurality of products, an empirical missing rate "p" is determined for each process (FIG. 9). The missing rate "p" is not always set at a single value and may be set at multiple values.

$$p = \{DL/f/c - W(UD)\}/W(D) \quad (10)$$

For example, when a delay fault is dominant, the missing rate "p" is plotted for the respective products having roughly different frequencies on the assumption that the missing rate "p" is proportionate to "f" (operating frequency), so that the missing rate can be closer to an actual rate. Thus the accuracy of the failure remaining rate can be improved. More specifically, as expressed in formula (9), a layout element amount "W(D)" corresponding to a base fault detected with the missing rate "p" basically corresponds to each base fault "l". Thus regarding W(D,l), the missing rate may be allocated for each group of base faults corresponding to a certain condition. For example, in an LSI with a plurality of frequencies, a missing rate may be allocated to a base fault on a part operating in synchronization with respective frequency clocks and the missing rate may be set at 0 for a base fault on a part operating in synchronization with a low frequency clock. With this missing rate, it is expected that a failure remaining rate can be obtained with higher accuracy. Although only a single kind of fault model (stuck-at fault) as a base was illustrated in the above explanation, it is surely easy to expand the fault model to a plurality of faults as a base with less expressible missing rates.

As described above, in the second embodiment, a "missing rate" is defined for a detected fault based on the limit of the fault model and the failure remaining rate (test quality measure) "DL" is determined.

Thus as compared with the prior art, it is possible to obtain a test quality measure (failure remaining rate) having higher correlation with a return rate of each LSI from the market (or the sum of the return rate and a rejection rate in a system test before shipment). In other words, it is possible to effectively create test patterns and improve the test quality.

Further, by collectively expressing a reason for a decrease in correlation with a single parameter, the fault model can be substantially expanded in a simple and effective manner.

Figure 10:
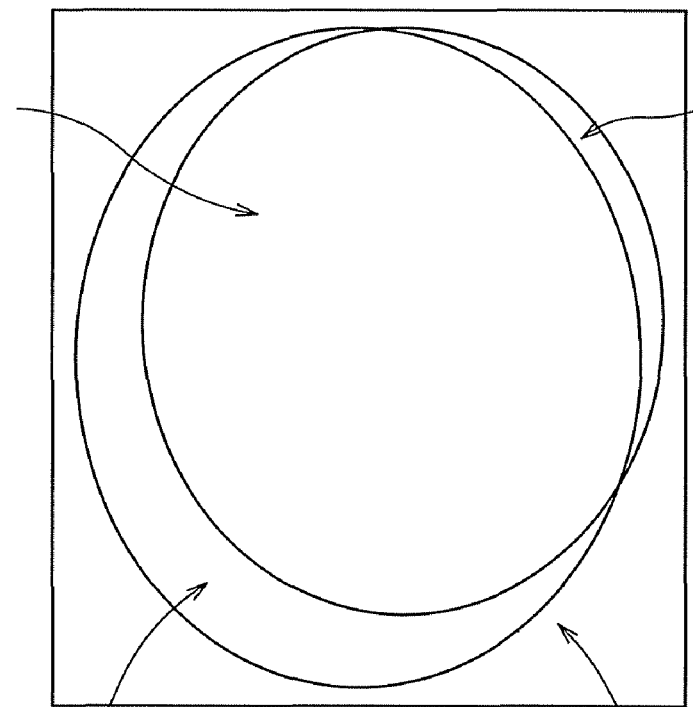
FIG. 10 is a conceptual illustration showing a concept for adopting fault models other than the base fault model.

FIG. 10 is a conceptual illustration showing a concept for adopting fault models other than the base fault model.

In the second embodiment, even the influence of failures of modes not covered by the base fault model can be adopted into a failure remaining rate with high accuracy. However, the missing rate is an empirical parameter and thus it takes a long time to increase the accuracy.

When using not only the detected/undetected information of the base fault model but also detected/undetected fault information including patterns generated for the faults of fault models more properly corresponding to the failures of modes hardly covered by the base fault model, the accuracy of correlation is increased by a designation by using not only the detected/undetected information of the base fault model but also detected/undetected information of other fault models, so that a failure remaining rate can be efficiently obtained (FIG. 10) with high accuracy (high correlation with the rejection rate of a product).

To be specific, regarding the layout element "Wj(D,l)" of the base fault model in formula (9), detected/undetected information "(D_k, UD_k)" of other fault models "k" is superimposed and the formula is changed as follows:

$$pij(l) \times Wj(D,l) \rightarrow p1ij \times Wj(D,l,UD\_k) + p2ij \times Wj(D,l,D\_k)$$

A newly examined missing rate "p1ij" is important. Even a fault having been detected as a base fault is not detected in other fault models "k" and p1ij>>p2ij is established. Thus in most cases, only "p1ij" has to be practically considered.

In the foregoing explanation, it should be noted that in the presence of a test pattern for a fault of the base fault model and a test pattern for the faults of fault models other than the base fault model, it is necessary to examine how many faults of the base fault model are additionally detected particularly by the latter test pattern.

Generally, this examination can be easily carried out by a fault simulation (a simulation associated with an ATPG tool can be used for an ATPG pattern). As a result, faults having been undetected by the test pattern of the base fault model may be newly detected by the test patterns of other fault models "k".

Regarding the newly detected faults, by additionally defining the corresponding patterns as patterns for the base fault model, classification can be made into the detection of faults of the base fault model and the detection of faults of other fault models, thereby achieving a technique with consistency.

As described above, since the detected/undetected information of other fault models is surely considered, it is expected that a failure remaining rate can be estimated with higher accuracy than in the first embodiment.

As described above, according to the test quality evaluating and improving system for a semiconductor integrated circuit and a test quality evaluation and improvement method for the semiconductor integrated circuit according to the present embodiment, the test quality can be improved.

What is claimed is:

1. A test quality evaluating and improving system for a semiconductor integrated circuit, comprising:
   a fault-layout information link section which creates a weighted fault dictionary by correlating a layout element related to an undetected fault, out of faults corresponding to a specified fault model and occurring in a circuit to be tested, with the undetected fault as a weight of the undetected fault which cannot be detected by a test pattern for testing the faults;
   a test quality measure calculating section which multiplies the weight of the undetected fault, the failure mode-fault model correlation factor for correlating the failure mode of the layout element and the fault model, and the failure occurrence rate of each layout element, and outputs an obtained product as a failure remaining rate of the test pattern;
   a determining section which determines whether the failure remaining rate is not larger than a target value; and
   a test point inserting section which inserts, when the determining section determines that the failure remaining rate is larger than the target value, a test point into a logical net of the circuit to be tested, the test point being inserted to preferentially detect an undetected fault having a large weight based on the weighted fault dictionary.

2. The test quality evaluating and improving system for a semiconductor integrated circuit according to claim 1, wherein the undetected fault only includes a fault related to a system operation of the circuit to be tested.

3. The test quality evaluating and improving system for a semiconductor integrated circuit according to claim 2, wherein the fault-layout information link section correlates a layout element related to an undetected fault with the undetected fault as a weight of the undetected fault which cannot be detected by the test pattern after the test point is inserted, and updates the weighted fault dictionary, and
   the test quality measure calculating section multiplies again the weight of the undetected fault, the failure mode-fault model correlation factor for correlating the failure mode of the layout element and the fault model, and the failure occurrence rate of each layout element, and outputs an obtained product as a failure remaining rate of the test pattern.

4. The test quality evaluating and improving system for a semiconductor integrated circuit according to claim 3, wherein the layout element is one of power supply wiring (unit length), signal wiring (unit length), and a via having a minimum size.

5. The test quality evaluating and improving system for a semiconductor integrated circuit according to claim 2, wherein the layout element is one of power supply wiring (unit length), signal wiring (unit length), and a via having a minimum size.

6. The test quality evaluating and improving system for a semiconductor integrated circuit according to claim 1, wherein the fault-layout information link section correlates a layout element related to an undetected fault with the undetected fault as a weight of the undetected fault which cannot be detected by the test pattern after the test point is inserted, and updates the weighted fault dictionary, and
   the test quality measure calculating section multiplies again the weight of the undetected fault, the failure mode-fault model correlation factor for correlating the failure mode of the layout element and the fault model, and the failure occurrence rate of each layout element, and outputs an obtained product as a failure remaining rate of the test pattern.

7. The test quality evaluating and improving system for a semiconductor integrated circuit according to claim 6, wherein the layout element is one of power supply wiring (unit length), signal wiring (unit length), and a via having a minimum size.

8. The test quality evaluating and improving system for a semiconductor integrated circuit according to claim 1, wherein the layout element is one of power supply wiring (unit length), signal wiring (unit length), and a via having a minimum size.

9. A test quality evaluating and improving system for a semiconductor integrated circuit, comprising:
   a fault-layout information link section which creates a weighted fault dictionary by correlating a layout element related to an undetected fault, out of faults corresponding to a specified fault model and occurring in a circuit to be tested, with the undetected fault as a weight of the undetected fault which cannot be detected by a test pattern for testing the faults, and creates a weighted detected fault dictionary by correlating a layout element related to a detected fault with the detected fault as a weight of the detected fault which can be detected by the test pattern out of the faults;
   a test quality measure calculating section which multiplies a sum of a weight of the undetected fault and a value obtained by multiplying the weight of the detected fault by a missing rate of other faults occurring on the layout element when the faults can be detected by the test pattern, a failure mode-fault model correlation factor for correlating a failure mode of the layout element and the fault model, and a failure occurrence rate of each layout element, and outputs an obtained product as a failure remaining rate of the test pattern;
   a determining section which determines whether the failure remaining rate is not larger than a target value; and
   a test point inserting section which inserts, when the determining section determines that the failure remaining rate is larger than the target value, a test point into a logical net of the circuit to be tested, the test point being inserted to preferentially detect an undetected fault having a large weight based on the weighted fault dictionary.

10. The test quality evaluating and improving system for a semiconductor integrated circuit according to claim 9, wherein the undetected fault only includes a fault related to a system operation of the circuit to be tested.

11. The test quality evaluating and improving system for a semiconductor integrated circuit according to claim 10, wherein the fault-layout information link section correlates a layout element related to an undetected fault with the undetected fault as a weight of the undetected fault which cannot be detected by the test pattern after the test point is inserted, and updates the weighted fault dictionary, and the test quality measure calculating section multiplies again the weight of the undetected fault, the failure mode-fault model correlation factor for correlating the failure mode of the layout element and the fault model, and the failure occurrence rate of each layout element, and outputs an obtained product as a failure remaining rate of the test pattern.

12. The test quality evaluating and improving system for a semiconductor integrated circuit according to claim 11, where in the layout element is one of power supply wiring (unit length), signal wiring (unit length), and a via having a minimum size.

13. The test quality evaluating and improving system for a semiconductor integrated circuit according to claim 10, where in the layout element is one of power supply wiring (unit length), signal wiring (unit length), and a via having a minimum size.

14. The test quality evaluating and improving system for a semiconductor integrated circuit according to claim 9, wherein the fault-layout information link section correlates a layout element related to an undetected fault with the undetected fault as a weight of the undetected fault which cannot be detected by the test pattern after the test point is inserted, and updates the weighted fault dictionary, and the test quality measure calculating section multiplies again the weight of the undetected fault, the failure mode-fault model correlation factor for correlating the failure mode of the layout element and the fault model, and the failure occurrence rate of each layout element, and outputs an obtained product as a failure remaining rate of the test pattern.

15. The test quality evaluating and improving system for a semiconductor integrated circuit according to claim 14, where in the layout element is one of power supply wiring (unit length), signal wiring (unit length), and a via having a minimum size.

16. The test quality evaluating and improving system for a semiconductor integrated circuit according to claim 9, where in the layout element is one of power supply wiring (unit length), signal wiring (unit length), and a via having a minimum size.

17. A test quality evaluation and improvement method for a semiconductor integrated circuit, comprising:

creating a weighted fault dictionary by correlating a layout element related to an undetected fault, out of faults corresponding to a specified fault model and occurring in a circuit to be tested, with the undetected fault as a weight of the undetected fault which cannot be detected by a test pattern for testing the faults;

calculating a failure remaining rate of the test pattern by multiplying the weight of the undetected fault, a failure mode-fault model correlation factor for correlating a failure mode of the layout element and the fault model, and a failure occurrence rate of each layout element;

determining whether the calculated failure remaining rate is not larger than a target value; and inserting, when it is determined that the failure remaining rate is larger than the target value, a test point into a logical net of the circuit to be tested, the test point being inserted to preferentially detect an undetected fault having a large weight based on the weighted fault dictionary.

18. The test quality evaluation and improvement method for a semiconductor integrated circuit according to claim 17, wherein the undetected fault only includes a fault related to a system operation of the circuit to be tested.

19. The test quality evaluation and improvement method for a semiconductor integrated circuit according to claim 18, where in the layout element is one of power supply wiring (unit length), signal wiring (unit length), and a via having a minimum size.

20. The test quality evaluation and improvement method for a semiconductor integrated circuit according to claim 17, where in the layout element is one of power supply wiring (unit length), signal wiring (unit length), and a via having a minimum size.

* * * * *